US008389905B2

(12) United States Patent
Izutani et al.

(10) Patent No.: US 8,389,905 B2
(45) Date of Patent: Mar. 5, 2013

(54) HEATING APPLIANCE FOR COOKING

(75) Inventors: Tamotsu Izutani, Hyogo (JP); Keiko Isoda, Hyogo (JP); Hiroshi Tominaga, Hyogo (JP); Fumitaka Ogasawara, Hyogo (JP)

(73) Assignee: Panasonic Corporation, Osaka (JP)

( * ) Notice: Subject to any disclaimer, the term of this patent is extended or adjusted under 35 U.S.C. 154(b) by 566 days.

(21) Appl. No.: 12/663,305

(22) PCT Filed: Jun. 6, 2008

(86) PCT No.: PCT/JP2008/001449
§ 371 (c)(1),
(2), (4) Date: Dec. 7, 2009

(87) PCT Pub. No.: WO2008/149560
PCT Pub. Date: Dec. 11, 2008

(65) Prior Publication Data
US 2010/0176112 A1 Jul. 15, 2010

(30) Foreign Application Priority Data

Jun. 7, 2007 (JP) ................................ 2007-151410
Apr. 9, 2008 (WO) .................. PCT/JP2008/000920

(51) Int. Cl.
*H05B 1/00* (2006.01)
(52) U.S. Cl. ..................................................... 219/220
(58) Field of Classification Search .................... 219/220
See application file for complete search history.

(56) References Cited

U.S. PATENT DOCUMENTS

| 2003/0164370 | A1* | 9/2003 | Aihara et al. ................. 219/622 |
| 2009/0032007 | A1 | 2/2009 | Satou |
| 2009/0261088 | A1 | 10/2009 | Isoda et al. |

FOREIGN PATENT DOCUMENTS

CN 1578544 2/2005
(Continued)

OTHER PUBLICATIONS

International Search Report issued Sep. 16, 2008 in International (PCT) Application No. PCT/JP2008/001449.

(Continued)

*Primary Examiner* — Howard Weiss
*Assistant Examiner* — Sue Tang
(74) *Attorney, Agent, or Firm* — Wenderoth, Lind & Ponack, LLP.

(57) ABSTRACT

A rear surface of an operating region disposed forwardly of a top plate and colored is coated with conductor detecting units, each slotted to define a command display and a frame display therein and having a light shielding property, and associated conductor connectors, while a light shielding film having an insulating property is formed around them. A planar light emitting member is arranged below the conductor detecting units so as to confront them so that each of the conductor detecting units can be recognized as an operating button when the planar light emitting member emits light, but when the light emitting member is blacked out, such operating button can be made hard for the user to look at, thereby increasing the operability and the design feature of the outer appearance of a cooking appliance.

10 Claims, 9 Drawing Sheets

FOREIGN PATENT DOCUMENTS

| | | |
|---|---|---|
| DE | 10 2004 026 836 | 12/2005 |
| JP | 63-139734 | 9/1988 |
| JP | 10-214677 | 8/1998 |
| JP | 2003-142244 | 5/2003 |
| JP | 2003-208972 | 7/2003 |
| JP | 2003-272816 | 9/2003 |
| JP | 2003272816 A * | 9/2003 |
| JP | 2005-38739 | 2/2005 |
| JP | 2005-93209 | 4/2005 |
| JP | 3741667 | 2/2006 |
| JP | 2006-128019 | 5/2006 |
| JP | 2006-196395 | 7/2006 |
| JP | 2006-318735 | 11/2006 |
| JP | 2007-107800 | 4/2007 |
| JP | 2008-91193 | 4/2008 |
| WO | 01/07835 | 2/2001 |
| WO | 2007/043505 | 4/2007 |
| WO | 2008/013220 | 1/2008 |

OTHER PUBLICATIONS

European Search Report, issued Apr. 3, 3012 in European application 08 76 4046.2, which is a counterpart to the present application.

English translation of International Preliminary Report on Patentability and Written Opinion of the International Searching authority issued Dec. 7, 2009, in PCT/JP2008/001449.

International Search Report (in English) issued Jul. 15, 2008 in counterpart application PCT/JP2008/000920.

International Preliminary Report on Patentability and Written Opinion of the International Searching Authority (in English) issued Nov. 30, 2010 in counterpart application PCT/JP2008/000920.

Supplemental European Search Report, issued Apr. 19, 2012 in EP application 08 76 4047.0, which is a counterpart to the present application.

* cited by examiner

FIG. 9 - PRIOR ART

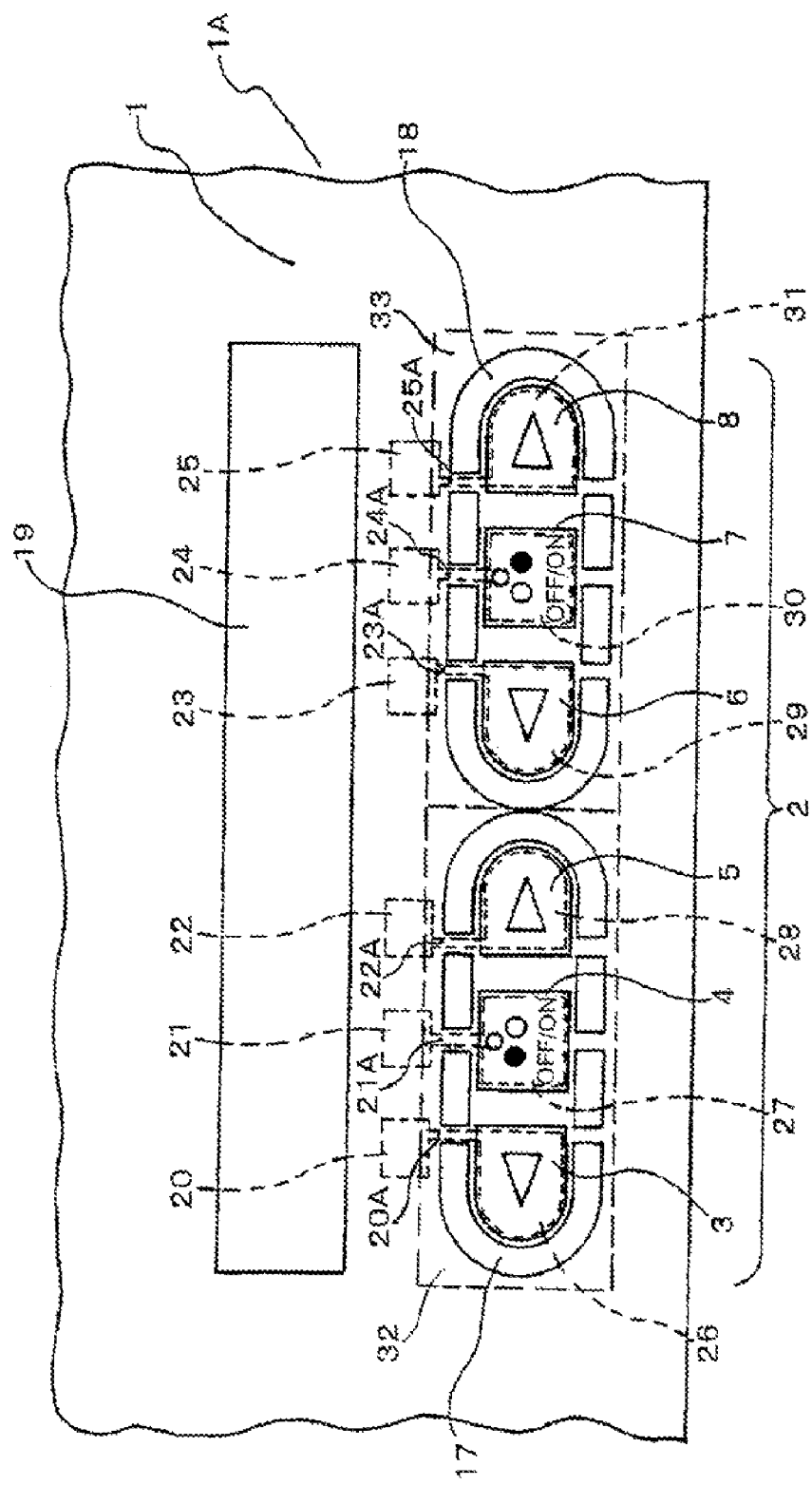
FIG. 10 - PRIOR ART

HEATING APPLIANCE FOR COOKING

TECHNICAL FIELD

The present invention relates to an operating device for operating a heating appliance for cooking.

BACKGROUND ART

In a cooking appliance such as, for example, an induction heating appliance for cooking, a housing, in which a plurality of heaters or induction heating coils, an inverter circuit and a control device for the inverter circuit are accommodated, has its top provided with a top plate made of a heat resistant glass. A cooking container to be heated is generally placed atop the top plate in alignment with a heating region indicatively marked by, for example, a circle depicted on the top plate. In the standard induction heating appliance, the heating region is generally employed three in number, with three heating regions defined at respective predetermined positions each indicated by the circle, so that three cooking containers can be simultaneously heated for cooking. Various operating elements for the induction heating appliance that are to be manipulated by the user one at a time, including, for example, electric power switches, adjustment knobs for adjusting heating capacities and indicator lamps and labels, are integrated on an operating panel. In some models now available in the market, the operating panel is of a fixed type, i.e., a type fixed to a portion of a front surface of the housing, which is perpendicular to the top plate. The operating panel of the fixed type lies perpendicular to the top plate and is positioned below the top plate and, therefore, when the user desires to operate one or some of those operating elements and/or to ascertain statuses of indicators and/or labels, the user is required to bend his or her upper body down and look at the operating panel. For this reason, the prior art cooking appliance has a problem associated with operability of such appliance.

As an improved version of the fixed type operating panel referred to above, a rotary container type of the operating panel has been made available, in which the operating panel is accommodated in a rotatable compact box and the latter is in turn mounted on a front portion of the housing. Since this rotary container type operating panel is, when in use, pulled to pivot forwards and is, when not in use, concealed deep within the housing, such operating panel is appealing in that it will not provide an obstruction to the user when accommodated within the housing. However, when in use, the rotary container type may occasionally provide an obstruction to the user as the operating panel remains pulled to pivot forward. In view of this, some users come to be accustomed to using the operating panel of the rotary container type in such a way that only when access to the operating panel is needed during cooking, he or she pulls the rotary container to pivot forward in readiness for manipulation of one or some of the operating elements, but when such access is no longer necessary, he or she pushes the rotary container to pivot backwards to allow it to be completely accommodated within the housing. This is indeed tiresome to handle and even this rotary container type similarly has a problem associated with operability.

In an attempt to alleviate the foregoing problems, the cooking appliance of a similar kind comfortable to handle has been disclosed, in which the operating switches and indicators are disposed in an endwise region of the top plate close to the user (which region is hereinafter referred to as a foreside of the top plate) together with a backlighting unit so that when those operating elements are in a condition ready to be operated, the backlighting unit can be activated to illuminate a periphery of those operating elements to provide the user with an indication of "Readily Available for Operation" (see, for example, Japanese Laid-Open Patent Publication No. 2003-272816).

According to the above mentioned prior art, and as shown in FIGS. 9 and 10, the top plate 1 has a top operating unit 2 provided in a widthwise intermediate region of the foreside thereof, and this top operating unit 2 includes a plurality of operating pads 3 to 8 provided in the top plate so that the user can manipulate. On the side of the housing 9, an operating circuit unit 10 is provided, which is connected with the top operating area 2 when the top plate 1 is mounted on the housing 9. The operating circuit unit 10 is provided with a display unit for providing a visual indication of an operating condition of one of the heating regions. Heating elements (heating unit) 11 such as, for example, a radiant heater and one or more induction heating coils aligned with the heating regions are disposed within the housing 9 and beneath the top plate 1. Each of the heating elements 11 is connected with an inverter unit 13 that is controlled by a control unit 12. When one of the heating elements 11 is an induction heating coil, a high frequency electric power of a frequency within the range of 20 kHz to 100 kHz is supplied thereto from the inverter unit 13. When the induction heating coil is to be used, the induction heating coil 11 comes to be positioned below a pan 14 with the top plate 1 intervening therebetween and, therefore, the heating regions and the operating region can be defined on the same plane. For this reason, the heating appliance for cooking can be obtained, in which the risk of operating it erroneously is minimized and the operability, such as, for example, ease of cleaning the top plate surface, is increased. The operating circuit unit 10 is connected with the control unit 12 so that a signal generated as a result of manipulation by the user can be applied to the control unit 12. Also, a display signal indicative of an operating condition of the heating region is applied from the control unit 12 to a display device in the operating circuit unit 10.

Each of the heating regions in the top plate 1 is provided with a temperature sensor 15 for detecting the temperature of the pan 14 and a pan detector 16 for detecting the presence or absence of the pan 14 on the respective heating region, both of which are connected with the control unit 12. The control unit 12 and the inverter unit 13 are connected with an alternating current power source of, for example, AC 200 volts and are therefore supplied with an alternating current.

Each of the operating pads 3, 4, 5, 6, 7 and 8 is in the form of an electrically conductive film laid on a top surface 1A of the top plate 1. Since each of the operating pads 3 to 8 is an area on which the user lays a finger when the associated heating element 11 (In the illustrated prior art appliance shown in FIGS. 9 and 10, two heating elements 11 are employed, but only one is shown in FIG. 9 since FIG. 9 is a transverse sectional view of the appliance.) is desired to be activated, each operating pad 3 to 8 is referred to as "an operating region". Those operating pads 3 to 8 are formed each by an electrically conductive film such as, for example, a painted or screen printed film of an electrically conductive inking material or paint, or a vapor deposited film of a metallic material and are printed with triangle and round markings and legends "ON" and "OFF" by the use of inking materials or paints of different colors. The operating pads 3 to 5 are associated with the left heating region to switch the corresponding heating coil on or off and also to adjust the heating capacity, whereas the operating pads 6 to 8 are associated with the right heating region to switch the corresponding heating coil on or off and also to adjust the heating capacity. The operating pads 4 and 7 are power switches used to initiate or terminate heating in the respective heating regions. The top plate 1 has a transparent region 17 made up of transparent areas 17 including two semicircular and four bar-shaped areas, which surround the operating pads 3 to 5, and a similar transparent region 18 made up of similar transparent areas 18 which similarly surround the operating pads 6 to 8.

A rectangular transparent region 19 is also provided above the transparent regions 17 and 18, through which the heating power can be indicated by means of light emitting diodes (LEDs).

Connectors 20 to 25 are connected with detecting units 26 to 31 through respective connecting conductors 20A to 25A. The detecting units 26 to 31, the connecting conductors 20A to 25A and the connectors 20 to 25 are each in the form of an electrically conductive film formed in an undersurface 1B of the top plate 1 by the use of a painting or screen printing technique of an electrically conductive paint or a metal vapor deposition technique.

The operating pads 3 to 8 are provided with backlighting units 32 and 33 positioned therebelow for projecting illuminating rays of light upwardly. When the housing 9 is combined together with the top plate 1, the backlighting unit 32 overlaps the transparent region 17 and the backlighting unit 33 overlaps the transparent region 18. Accordingly, one or both of the backlighting units 32 and 33 associated with the left and right heating regions, respectively, can be illuminated when one or both of the backlighting units 32 and 33 is/are energized, to thereby inform the user that such heating region or regions is/are in an "operable condition".

It has, however, been found that since in the prior art system discussed above, one or both of peripheral areas of the top plate 1 around the operating pads 3 to 8 is/are illuminated by the corresponding backlighting units 32 and 33 to inform the user that one or both of the heating regions is/are in an "operable condition", one or both of the illuminated transparent regions 17 and 18 is/are highly noticeable enough to provide a considerable difference in brightness between them and respective faces of the operating pads 3 to 8 which are not lighted. This difference in brightness makes the user feel difficulty in noticing legends such as, for example, ON and OFF appearing on the faces of the operating pads 3 to 8. In addition, in view of the fact that the connecting conductors 20A to 25A for connecting the connectors 20 to 25 with the associated detecting units 26 to 31 are so laid as to traverse the transparent regions 17 and 18, the transparent regions 17 and 18 then illuminated are so segmentalized as to permit the transparent regions 17 and 18 to be awkwardly noticed and, hence, the prior art appliance lacks an appealing feature in design.

SUMMARY OF THE INVENTION

The present invention is therefore devised to substantially eliminate the foregoing problems and inconveniences inherent in the prior art appliance and is intended to provide a heating appliance for cooking, which is easy to handle and has not only an appealing feature in design, but also an increased operability; in which operating elements for adjusting, for example, the heating power of a heating unit are provided on an easily accessible top panel and operating buttons are so designed as to emit rays of light, to thereby provide a highly sophisticated visibility; in which one or some of the operating buttons, which is/are available for manipulation, are so illuminated as to permit the user to readily notice it or them; and in which some of the operating buttons, which are not available for manipulation, are made difficult to look at so as to allow the user to readily find some of the operating buttons, which are available for manipulation, at a glance.

In accomplishing the above objective, the present invention provides a heating appliance for cooking, which includes a top plate in the form of a plate-like member made of a material having an electrically insulating property and a light transmitting property and mounted atop a housing; a heating unit disposed inside the housing for heating an article to be heated which has been placed on a top surface of the housing; an operating region defined on the top plate and formed by coloring the top plate so as to have a low transmittance of light passing through the top plate; a conductor detecting unit formed of an electrically conductive material on a rear surface of the operating region; a control unit operable to control the heating unit based on a command inputted in response to detection that a surface portion of the top plate proximate to the conductor detecting unit has been touched; a conductor connector made of an electrically conductive material and provided on the rear surface of the operating region and connected with an outer edge of the conductor detecting unit; a connecting terminal held in contact with the conductor connector and electrically connected with the control unit; a planar light emitting member disposed below the conductor detecting unit in face-to-face relation therewith; and a light source for emitting rays of light that are incident upon the planar light emitting body; in which the conductor detecting unit is provided with a frame display, formed by a frame shaped slotted portion, and a command display formed inwardly of the frame display and bearing an alphanumerical character or a pictorial letter in the form of a slotted portion for displaying the command; and in which a light shielding film having an insulating property is formed around the conductor detecting unit and the conductor connector so that when the control unit causes the planar light emitting member to emit light to thereby cause the command display to be illuminated, with the planar light emitting member being blacked out to render the frame display and the command display difficult to see.

The heating appliance for cooking according to the present invention is provided on a top panel portion, readily accessible, with the operating button for the adjustment of, for example, the heating power of the heating unit, such that the frame display and the command display, each operable to provide a visual indication of the range of the operating button, can emit light therethrough, but the operating button in its entirety can be made invisible when they are not in position to emit light therethrough, thereby increasing the visibility considerably. Also, arrangement has been made so that only the operating button available for manipulation can be illuminated to inform the user that such operating button is available for manipulation, thereby increasing the operability and the design feature of the cooking appliance. In addition, the connecting terminal through which the conductor connector forming the operating button and the control unit together is of a simple construction and is so designed that it will not intercept the path of light in the operating button and that the sense of discomfort the user may have when the control unit detects a control command as a result of touch on the conductor connector can be reduced.

BRIEF DESCRIPTION OF THE DRAWINGS

FIG. 9 is a sectional view showing the prior art cooking appliance.

FIG. 10 is a fragmentary top plan view on an enlarged scale, showing the operating region employed in the prior art cooking appliance. Explanation of Reference Numerals

DETAILED DESCRIPTION OF THE INVENTION

Figure 1:
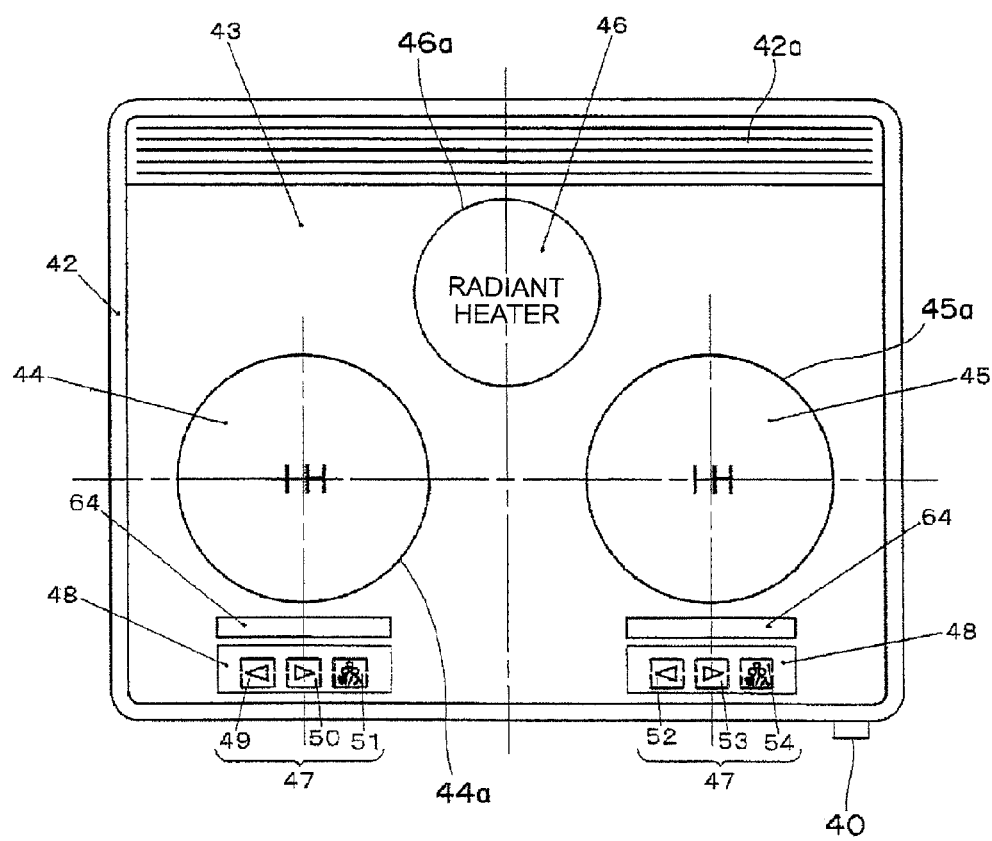
FIG. 1 is a top plan view of a heating appliance for cooking according to a first preferred embodiment of the present invention.

The first invention is so configured that a heating appliance for cooking may include a top plate in the form of a plate-like member made of a material having an electrically insulating property and a light transmitting property and mounted atop a housing; a heating unit disposed inside the housing for heating an article to be heated which has been placed on a top surface of the housing; an operating region defined on the top plate and formed by coloring the top plate so as to have a low transmittance of light passing through the top plate; a conductor detecting unit formed of an electrically conductive material on a rear surface of the operating region; a control unit operable to control the heating unit based on a command inputted in response to detection that a surface portion of the top plate proximate to the conductor detecting unit has been touched; a conductor connector made of an electrically conductive material and provided on the rear surface of the operating region and connected with an outer edge of the conductor detecting unit; a connecting terminal held in contact with the conductor connector and electrically connected with the control unit; a planar light emitting member disposed below the conductor detecting unit in face-to-face relation therewith; and a light source for emitting rays of light that are incident upon the planar light emitting body; in which the conductor detecting unit is provided with a frame display, formed by a frame shaped slotted portion, and a command display formed inwardly of the frame display and bearing an alphanumerical character or a pictorial letter in the form of a slotted portion for displaying the command; and in which a light shielding film having an insulating property is formed around the conductor detecting unit and the conductor connector so that the control unit causes the planar light emitting member to emit light to thereby cause the command display to be illuminated, with the planar light emitting member being blacked out to render the frame display and the command display difficult to see. Accordingly, each of the operating buttons is so designed that when the frame display positioned inside the conductor detecting unit is illuminated, a region of such operating button can be displayed and, on the other hand, the command display is illuminated within it to display a function allocated to such operating button. Also, since the connecting terminal is connected with an outer edge of an outer periphery of the frame display, the command display can be arranged freely within the frame display without the connecting terminal disturbing the lighting of the command display. Moreover, since even when the conductor connector is extended a required widthwise dimension from the outer edge of the conductor detecting unit for the purpose of stabilizing the junction with the connecting terminal, the connecting terminal will not segmentalize the lighting of the frame display within such widthwise dimension, and the conductor connector can be brought close towards the conductor detecting unit. Unnaturalness appearing when a finger touches an upper portion of the conductor connector and the control unit detects that the operating button has inputted an operating command can be minimized as the conductor connector is disposed adjacent the conductor detecting unit having been spaced a distance as small as possible. Accordingly, the foregoing construction is effective to provide the cooking appliance that can contributes to a considerable increase of the visibility and has an increased operability.

The second invention is so configured that in the cooking appliance as set forth in the first invention described above, the conductor detecting unit may include a frame display formed in a generally rectangular shape, in which case such cooking appliance further includes a bridge portion for partially connecting an outside portion of the frame display and an inside portion of the frame display, the bridge portion being provided in at least one location on at least one of side edge portions of the frame display. Accordingly, the operating sensitivity of the conductor detecting unit can be stabilized at a high level and an unnatural light segmentalization during the lighting can be eliminated when the bridge portion is defined at a predetermined position in each of the conductor detecting units, allowing the cooking appliance to have an excellent design.

The third invention is so configured that in the cooking appliance as set forth in the first invention described above, the conductor detecting unit may include a frame display formed in a generally rectangular shape and further comprising a bridge portion for partially connecting an outside portion of the frame display and an inside portion of the frame display, the bridge portion being provided in at least one location on at least one corner portion of the frame display. Accordingly, the operating sensitivity of the conductor detecting unit can be stabilized at a high level and an unnatural light segmentalization during the lighting can be eliminated when the bridge portion is defined at a predetermined position in each of the conductor detecting units, allowing the cooking appliance to have an excellent design.

The fourth invention is so configured that in the cooking appliance as set forth in any one of the first to third inventions described above, the planar light emitting member may include a plate shaped light emitting body having a light emitting face formed therein in face-to-face relation with the conductor detecting unit and a plate shaped light guide portion lying perpendicular to the light emitting face and in which the light from the light source is allowed to enter an end face of the light guide portion formed at a location spaced from the top plate a further distance as compared with that from the light emitting body. Accordingly, even when the user accidently or improperly displaces a frying pan, which is heated, to a position adjacent the operating buttons, the risk of thermal destruction is minimized, allowing the light emitting reliability to be increased considerably because the light emitting diodes are separated from the top plate.

The fifth invention is so configured that the heating appliance for cooking as set forth in any one of the first to fourth inventions described above may further include a plurality of conductor detecting units, a plurality of conductor detecting units and a plurality of planar light emitting members held in face-to-face relation thereto and in which the control unit is operable to cause the plural planar light emitting members to be lit one at a time. Accordingly, some of the operating buttons (for example, the arrow button, bearing a rightwardly oriented arrow, when the heating power is maximum) that are not called for can be blacked out and, hence, invisible to the eyes of the user. Therefore, the user comes to recognize some of the plurality of operating buttons, which he or she considers necessary for manipulation and, hence, the operability can be increased considerably.

The sixth invention is so configured that the cooking appliance as set forth in any one of the first to fifth inventions described above may further include a plurality of conductor detecting units and a plurality of planar light emitting members held in face-to-face relation thereto and in which the control unit is operable to cause each of the plural planar light emitting members to be lit in a different color. Accordingly, by changing the color of one or some important operating buttons (for example, an ON/OFF button), the user can easily recognize the presence of such operating buttons, accompanied by increase of the operability of the cooking appliance.

The seventh invention is so configured that in the cooking appliance as set forth in the sixth invention described above, the plurality of the planar light emitting members may be lit in different colors by changing the color of the light emitted from the light source. Accordingly, by changing the color of one or some important operating buttons (for example, an ON/OFF button), the user can easily recognize the presence of such operating buttons, accompanied by increase of the operability of the cooking appliance.

The eighth invention is so configured that the cooking appliance as set forth in the sixth invention described above may further include filters of different colors interposed between end faces of the planar light emitting member, on which the light from the light source impinges, and the light source to allow the plural planar light emitting members to be lit in different colors. Accordingly, not only can a substrate be fabricated with the light emitting diodes of the same color in order to secure effects similar to those described above, but also the color of one or some of the important operating buttons (for example, an ON/OFF button) can be changed, to allow them to be easily recognized by the user and, also, increase the operability of the cooking appliance.

Hereinafter, the present invention will be described in detail in connection with preferred embodiments thereof with reference to the accompanying drawings. It is to be noted that the present invention is in no way limited to such embodiments as herein set forth.

First Embodiment

Figure 2:
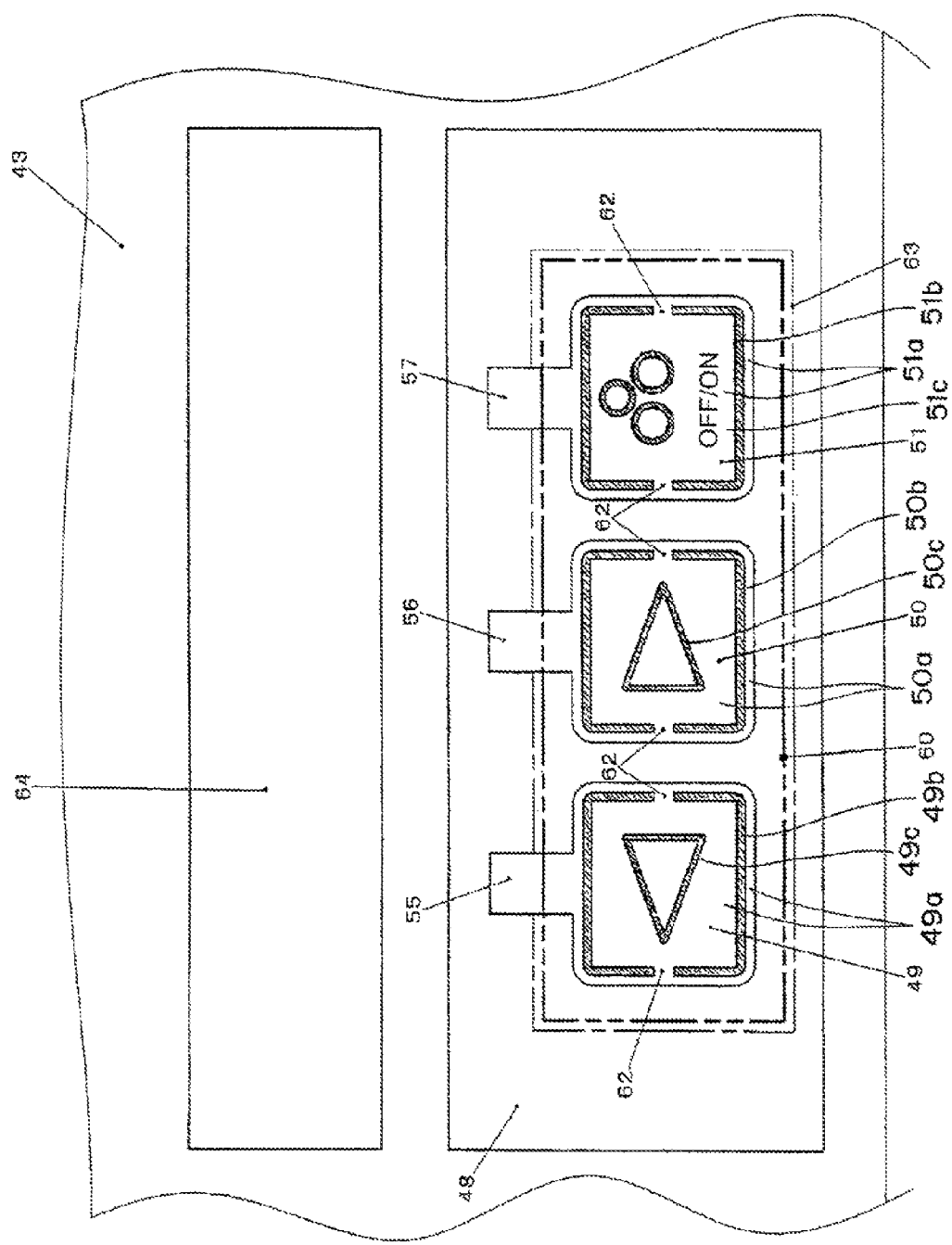
FIG. 2 is a fragmentary top plan view on an enlarged scale, showing an operating region and its vicinity in the cooking appliance shown in FIG. 1.

FIG. 1 is a top plan view showing an induction heating appliance, which is a heating appliance for cooking according to a first preferred embodiment of the present invention, (with operating buttons on a top plate shown as in lighting conditions); FIG. 2 is a fragmentary enlarged top plan view showing the operating buttons (together with detecting units and connectors that are applied to a rear surface of the top plate, but invisible from the front); and FIG. 3 is a fragmentary sectional view showing the operating buttons.

It is to be noted that parts of the description of the operation of the induction heating appliance itself, which are similar to those described in connection with the prior art cooking appliance with particular reference to FIGS. 9 and 10, are not reiterated for the sake of brevity.

Figure 3:
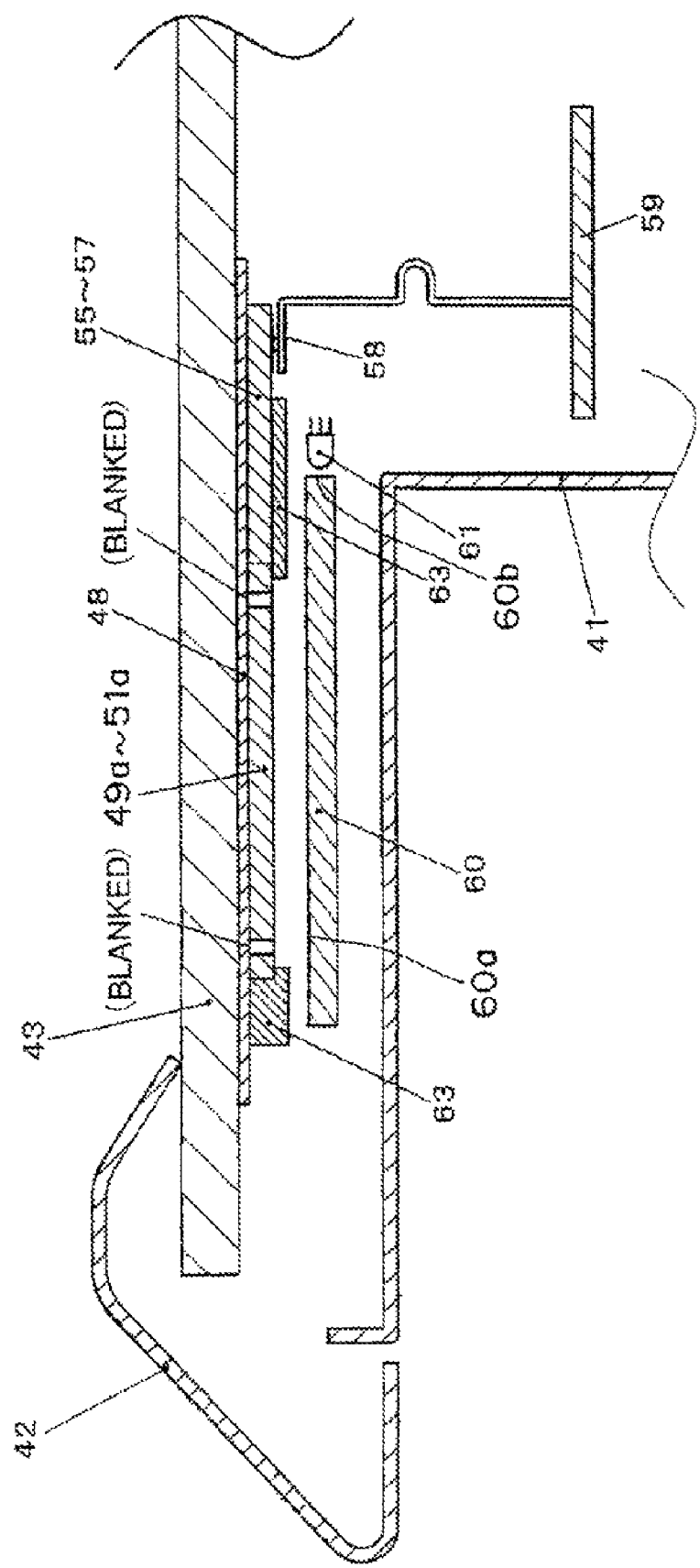
FIG. 3 is a fragmentary sectional view on an enlarged scale, showing the operating region and its vicinity in the cooking appliance shown in FIG. 1.

Referring now to FIGS. 1 to 3, a top plate 43 having an electric insulating property and prepared from a plate member made of a translucent material such as a heat resistance glass material, for example, a crystallized ceramic material has its four side edges trimmed with a metal frame 42 and a ventilating grille 42a and is placed atop a housing 41. It is to be noted that the top plate 43 may have its four side edges trimmed only with the metallic frame and with no ventilating grille 42 employed, or the metallic frame 42 may be dispensed with. The top plate 43 has heating regions indicated by respective heating region indicia 44a to 46a. Provided are a left heater unit 44 for induction heating an article to be heated (not shown) placed on the hearing region indicium 44a, a right heater unit 45 for induction heating an article to be heated (not shown) placed on the heating region indicium 45a, and a radiant heater unit 46 for heating an article to be heated (not shown) placed on the heating region indicium 46a, which radiant heater unit 46 is an electric resistance heating means having a resistance element capable of being heated, when an electric power is supplied across it, to emit a radiant heat.

A portion of the top plate 43 adjacent a forward side edge thereof with respect to the user standing in front of the cooking appliance is provided with left and right operating regions 47 within which operating buttons 49 to 54 for inputting control commands when they are touched are positioned. Each of the operating regions 47 is so colored as to have a low light transmittance. For example, a light permeable paint film 48 of a kind capable of transmitting therethrough a strong light appearing in the vicinity, but not transmitting a weak light, depending on the thickness of the paint film and the color strength, is printed on a rear surface of the top plate 43. With this construction, it is so structured that the inside is shielded from light and, unless light emission takes place in the above described vicinity, nothing can be seen from the outside of the housing. It is to be noted that it is not always necessary for only the operating regions 47 to be colored to reduce the light transmittance and the top plate, for example, in its entirety may be colored to reduce the light transmittance. Also, instead of the light permeable paint film 48 being printed on the rear surface of the transparent top plate 43, the top plate 43 may be prepared from a colored heat resistant glass.

As best shown in FIG. 2, conductor detecting units 49a to 51a corresponding respectively to an ON/OFF button, a heat power step up button and a heat power step down button are formed by the use of an electrically conductive coating material having a light shielding property such as, for example, a coating material containing carbon, which is applied to a rear surface of the operating regions 47. By way of example, a heat power step up button 49, a heat power step down button 50 and an Off/ON button 51 are provided in association with the left heater unit 44 and the conductor detecting units 49a to 51a, corresponding respectively to those operating buttons, are formed by blanking command displays 49c to 51c, indicative of respective control commands that are supplied to the control unit 59 when the associated operating buttons are pressed (touched), and frame displays 49b to 51b of a rectangular shape. It is to be noted that formation of the conductor detecting units 49a to 51a on the rear surface of the top plate 43 may be carried out by printing to form a printed film or pasting lengths of single-sided adhesive tape having an electrically conductive property.

In this way, the conductor detecting units 49a to 51a form the respective frame displays 49b to 51b on the inside thereof so that when illuminated the frame displays 49b to 51b and corresponding regions inwardly thereof can be recognized as respective operating buttons (In FIG. 2, light emitting areas are shown by the hatching). At this time, only blanked portions are illuminated whereas the remaining portions are light shielded by the coating. Also, conductor connectors 55 to 57 are provided so as to protrude from the conductor detecting units 49a to 51a in a direction away from the user. In other words, the generally rectangular conductor connectors 55 to 57, which are smaller in surface area than the corresponding conductor detecting units 49a to 51a, are connected with outer side edges of the generally rectangular conductor detecting units 49a to 51a so that the both, when viewed from above, represent a shape similar to the inverted shape of a figure "T". In addition, for the right heater unit 45, operating buttons 52 to 54 similar to those shown in FIG. 2 are formed by painting. Hereinafter, only the structural details of one of the heater units, for example, the left heater unit 44 will be described as a representative one.

A connecting terminal 58 provided on a printed circuit board forming a part of the control unit 59 for the left heater unit 44 is made of an electrically conductive material having an elasticity. This connecting terminal 58 may be employed in the form of, for example, a phosphor bronze as a base material which has been gold plated at respective portions thereof that are held in contact with the conductor connectors 55 to 57. The connecting terminal 58 is held in contact with the conductor connectors 55 to 57 and electrically connected with the control unit 59 to thereby electrically connect the conductor detecting units 49a to 51a and the control unit 59 with each other. In this arrangement, the control unit 59 outputs a high frequency voltage to the conductor detecting units 49a to 51a through the conductor connectors 55 to 57. When the user touches his or her finger on surface portions of the top plate 43 which confront the conductor detecting units 49a to 51a, a high frequency current flows from the conductor detecting units 49a to 51a to the user's finger as a result of electrostatic capacitive coupling. In other words, the electrostatic capacitance increases relative to the common potential of the conductor detecting units 49a to 51a as viewed from the control unit 59. The control unit 50 detects the increase of the electrostatic capacitance to thereby detect that the top plate 43 in the vicinity of the conductor detecting units 49a to 51a has been touched by the user. Thus, the conductor detecting units 49a to 51a forms respective electrodes of electrostatic capacitance type touch keys. Also, planar light emitting members 60 are arranged beneath the top plate 53 so as to confront the respective conductor detecting units 49a to 51a.

Each of the planar light emitting members 60 is made of a transparent resin such as, for example, polycarbonate and shaped in the form of a flat plate and has a light emitting face held in face-to-face relation with the corresponding conductor detecting unit 49a to 51a so that rays of light emitted from a light emitting diode 61, which is a light source and is disposed adjacent an end face 60b, can be guided to the light emitting face 60a to thereby enable the respective planar light emitting member 60 to provide a planar light. The light source 61 is not always limited to the light emitting diode.

Each of the conductor detecting units 49a to 51a is formed with an outer portion of the corresponding frame display 49b to 51b, an inner portion of the corresponding frame display 49b to 51b and a bridge portion 62 in the form of an electrically conductive portion having a small width of, for example, 1 mm for partially connecting the conductor detecting unit 49a to 51a and the flame display 49b together. Each of the bridge portions 62 can be formed simultaneously with printing of the other portion of the conductor detecting unit 49a. The bridge portion 62 is provided at an intermediate location of each of left and right sides of the corresponding frame display 49b to 51b, which is formed in a generally rectangular shape by means of a line, so as to be electrically connected with the associated conductor connector 55 to 57, and at least respective portions of the conductor detecting units 49a to 51a and the conductor connectors 55 to 57, which confront the light emitting faces 60a of the planar light emitting members 60, are covered by a light shielding film 63 that is formed by, for example, printing a light shielding paint. Positioned above the operating region 47 is a display window 64 for providing, for example, a visual indication of the status of heat power.

The operation of, and effects brought about by, the cooking appliance so constructed as hereinabove described will now be described.

Because of the foregoing construction, when not in use, for example, when an electric power switch 40 is turned off, the light emitting diodes 61 are deenergized with no light emitted therefrom and, therefore, the operating region 47 has its light transmittance lowered due to the light shielding film 48 and respective slotted shapes of the frame displays 49b to 51b and the command displays 49c to 51c of the conductor detecting units 49a to 51a are invisible to the user. This equally applies even when instead of the operating region 47 being provided with the light shielding film 48 as hereinabove described, the top plate 43 is so structured as to be colored and, hence, to have a low light transmittance as compared with that exhibited when it is not colored.

When the condition of use starts, for example, when the electric power switch 50 is turned on, the planar light emitting members 60 are lit and rays of light so emitted are shielded by the light shielding film 63 and portions of the conductor detecting units 49a to 51a other than the slotted portions, wherefore the rays of light transmit through the frame displays 49b to 51b, each formed in the respective conductor detecting unit 49a to 51a in a rectangular shape by means of a slotted line, and their associated legends and the command displays 49c to 51c, each formed in the form of a slotted pictorial legend, to the outside above the top plate 43 and to the sight of the user and, accordingly, not only can the operating buttons be displayed by illumination to show the respective commands allocated thereto, but also the user can clearly recognize the presence of those operating buttons. In view of the above, the present invention is effective to provide an operating panel in the cooking appliance, which has an appealing feature in design and is easy to handle.

At this time, since each of the bridging portions 62 in the conductor detecting units 49a to 51a is disposed at the intermediate portion of each of the left and right side edges of the corresponding frame display 49b to 51b, not only do the bridge portions 62 line up in a transverse direction, but also it can gleam symmetrically in an up and down direction with respect to a center axis defined by left and right side edges, with no segmentation of the light occurring, and, hence, an arrangement of the operating buttons, which is natural and comfortable to look at, can be realized.

It is, however, to be noted that the manner of arrangement of the bridge portions 62 is not necessarily limited to that shown and described. If the bridge portion is provided in at least one location on at least one of the side edges of each of the frame displays 49b to 51b, each formed in a generally rectangular shape by means of a slotted line, inner portions of the frame displays 49b to 51b in the conductor detecting units 49a to 51a and the conductor connectors 55 to 57 can be connected together and, therefore, not only can the sense of touch on the top plate in the vicinity of the conductor detecting units 49a to 51a be increased, but it can also be stabilized. Also, if the number of the bridge portions 62 is increased, there is the possibility that although the use of the increased number of the bridge portions results in increase of the reliability, portions where the rectangular frame shape is segmentalized increases in number and, therefore, a disadvantage may arise in respect of the aesthetic feature.

Figure 4:
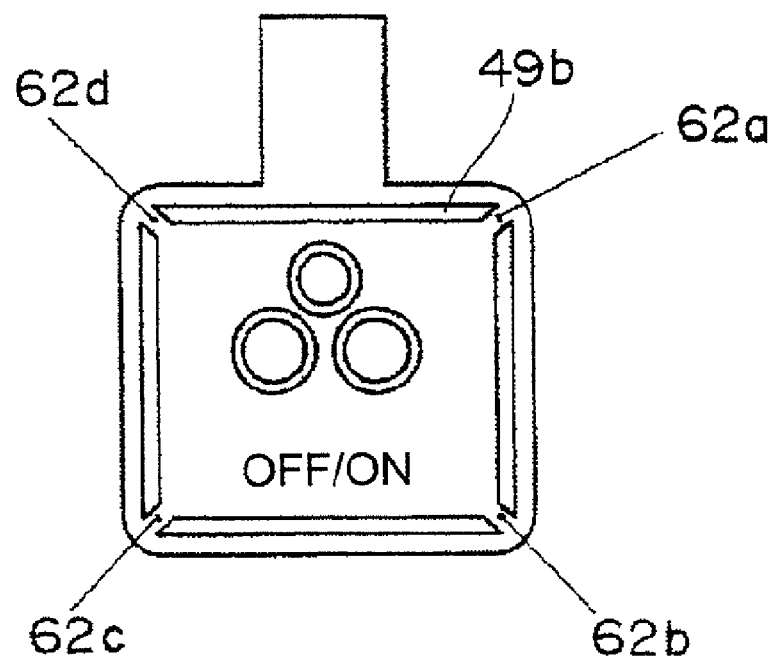
FIG. 4 is a fragmentary top plan view on an enlarged scale, showing a conductor detecting unit used in the cooking appliance shown in FIG. 1.

Also, as illustrated in a modified form of the present invention shown in FIG. 4, effects similar to those described hereinbefore can be obtained even when the bridge portions 62a to 62d are provided in respective corner portions of the rectangular side edges of the frame displays 49b each formed in a generally rectangular shape. Although in the modified form shown in FIG. 4, the bridge portions have been shown and described at four locations, only one of them may be employed with the remaining three dispensed with. Also, where two bridge portions are employed, the use of a combination of the two bridge portions 62a and 62c or only a combination of the two bridge portions 62b and 62c is particularly advantageous in that since when the combination is turned 180°, they are in rotational symmetrical relation with each other, representing the same shape and, therefore, unnaturalness can be minimized.

It is to be noted that although the sense of touch will be somewhat lowered during manipulation of the conductor detecting units 49a to 51a, the bridge portions 62a to 62d may be entirely dispensed with and, instead, the shape of the frame display 49b may be shaped in a frame shape that is not segmentalized. Since inner and outer portions of the frame display 49b of each of the conductor detecting units 49a to 51a are held proximate to each other, a capacitance coupling can take place therebetween. Also, the frame display 49b may be formed in a round or oval annular configuration in place of the generally rectangular shape shown and described.

Second Embodiment

Figure 5:
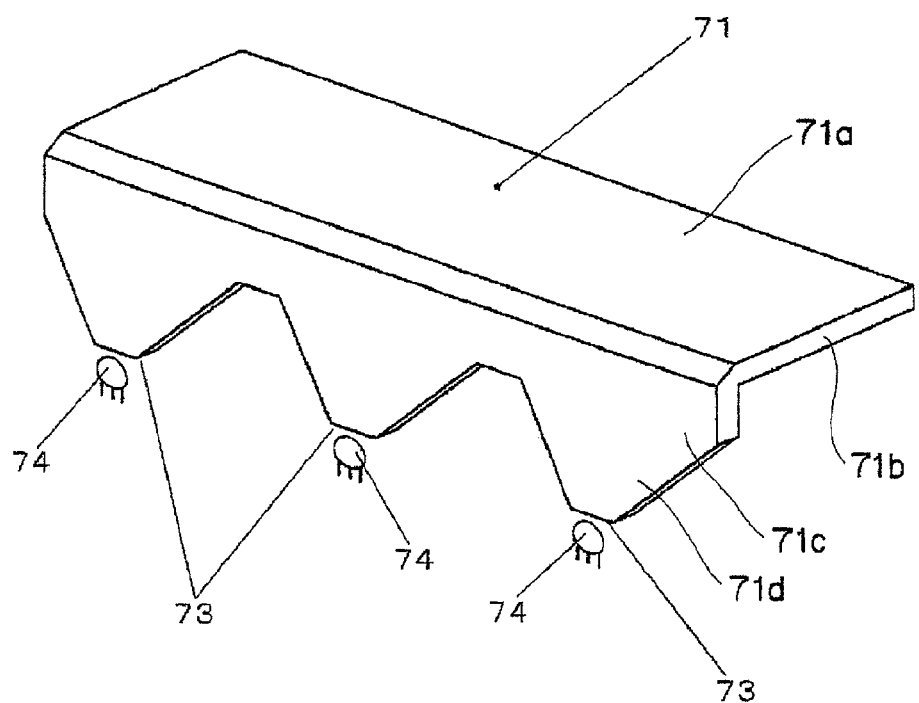
FIG. 5 is a perspective view on an enlarged scale, showing a planar light emitting element employed in the cooking appliance according to a second preferred embodiment of the present invention.
Figure 6:
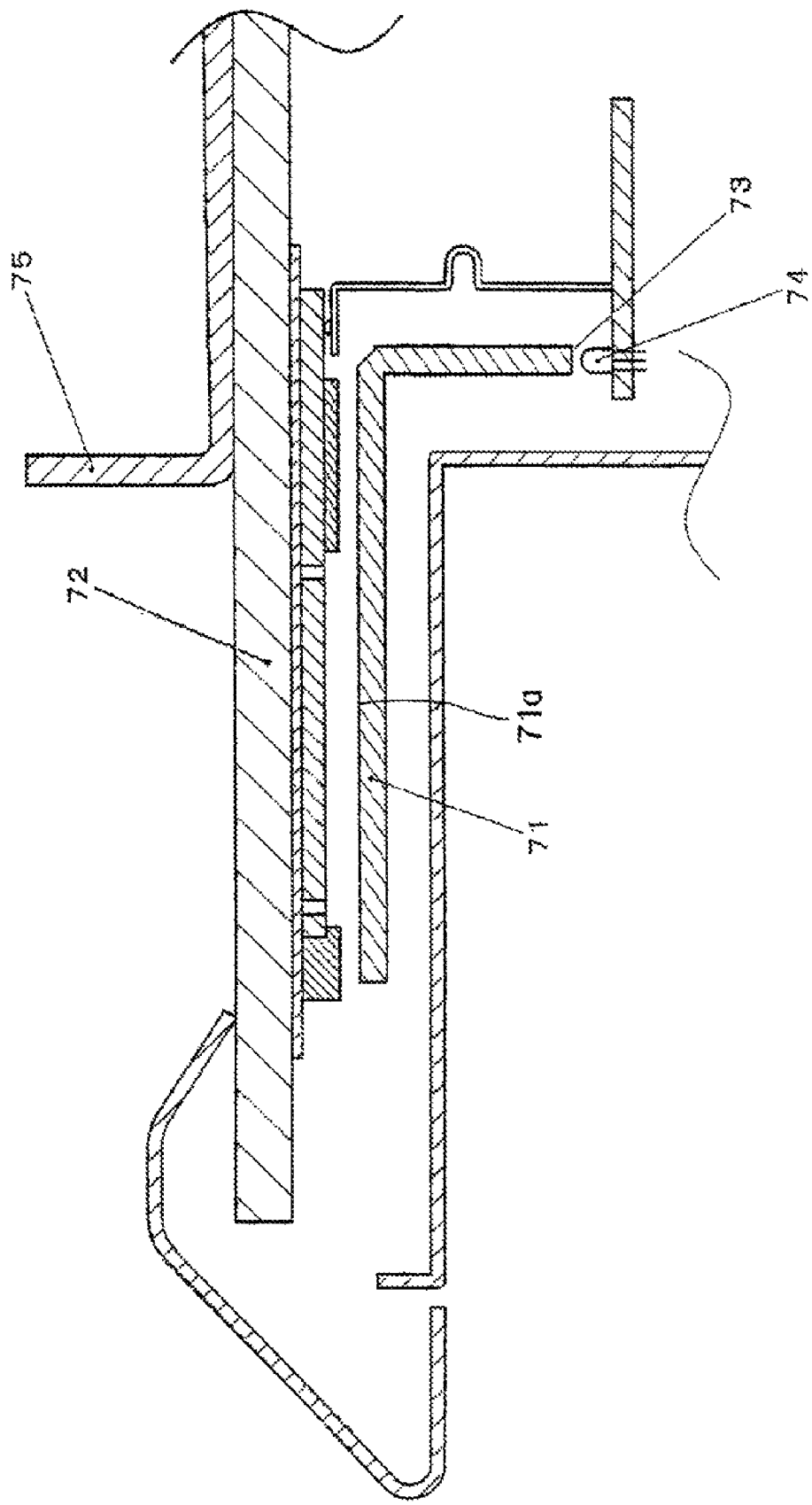
FIG. 6 is a fragmentary sectional view on an enlarged scale, showing the operating region and its vicinity shown in FIG. 5.

FIGS. 5 and 6 illustrate a fragmentary perspective view and a fragmentary sectional view showing an important portion of the induction heating appliance, which is the heating appliance for cooking according to a second preferred embodiment of the present invention.

Referring to FIGS. 5 and 6, a planar light emitting member 71 is formed in a generally L-sectioned configuration. The planar light emitting member 71 has a horizontally laid light emitting body 71b and a light guide portion 71c extending downwardly from one end of the light emitting body 71b, with light sources, for example, light emitting diodes 74 disposed in face-to-face relation with respective end faces 73. In other words, the planar light emitting member 71 is made up of the plate-like light emitting body 71b formed with the light emitting face 71a so as to confront the conductor detecting units 49a to 51a and the plate-like light guide portion 71c lying perpendicular to the light emitting body 71b, and is so designed that while the three light emitting diodes 74 are disposed in proximity to the end faces 73 of the light guide portion 71c which is formed spaced a distance larger than the distance between the light emitting body 71b and the top plate 43, rays of light emitted from the three light emitting diode 74 can enter through the end faces 73. Also, the light guide portion 71c is so formed that in order to guide the rays of light from the light emitting diodes 74 efficiently towards the light emitting body 71b, inclined edges are formed therein on respective sides to define light incident portions 71d of a generally reversed triangular shape each having a width progressively increasing from the corresponding light emitting face 73 in a direction towards the light emitting body 71b. The rays of light from the light emitting diodes 74 are, after having entered through the adjacent light incident portions 71d, reflected by the inclinations of the light incident portions 71d so as to travel efficiently upwardly.

The operation of, and effects brought about by, the heating appliance for cooking, which is so constructed as hereinabove described, will now be described.

Because of the foregoing construction, even when the user accidentally or improperly displaces a pan or a frying pan 7, which is a heated article, to a position adjacent the operating buttons, the risk of thermal destruction is minimized, allowing the light emitting reliability to be increased considerably since the light emitting diodes 74 are separated from the top plate 72.

Third Embodiment

Figure 7:
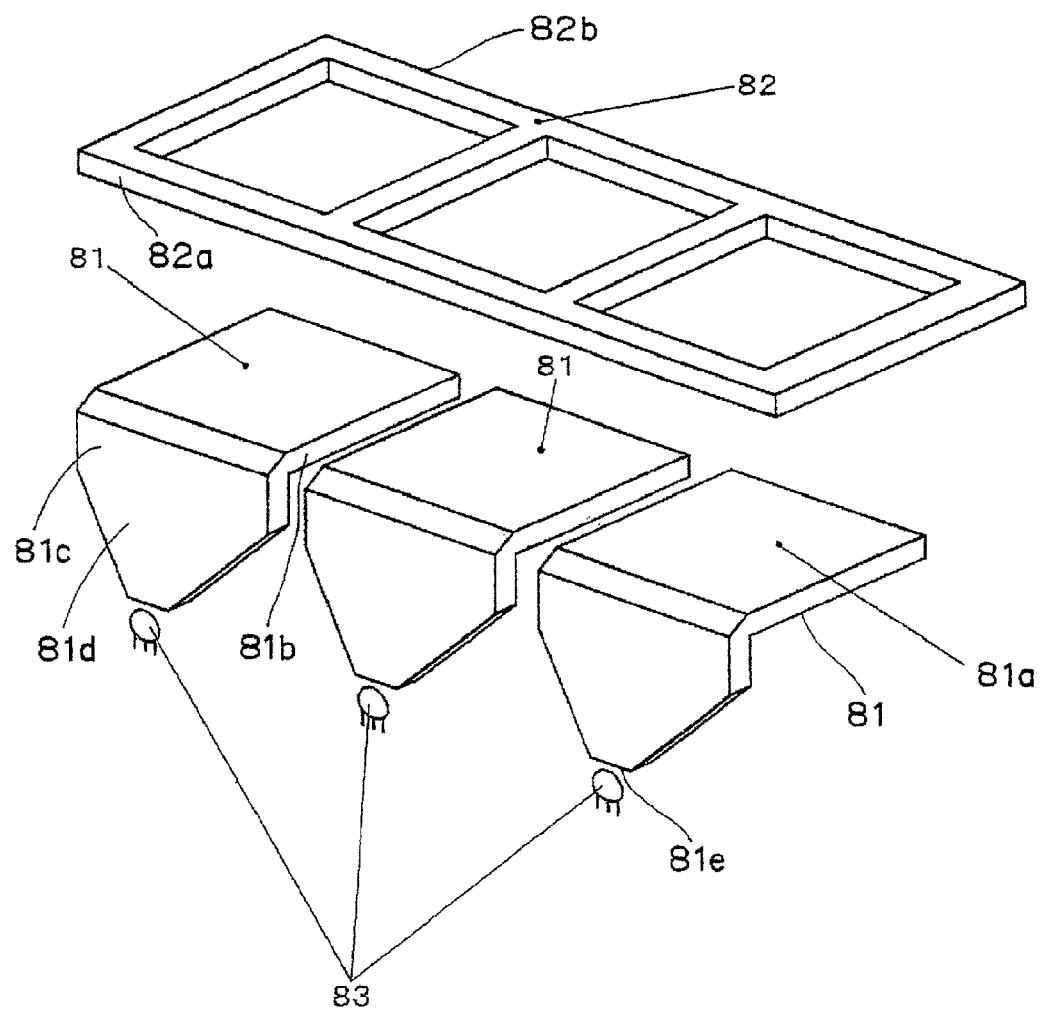
FIG. 7 is an exploded view showing the planar light emitting element employed in the cooking appliance according to a third preferred embodiment of the present invention.
Figure 8:
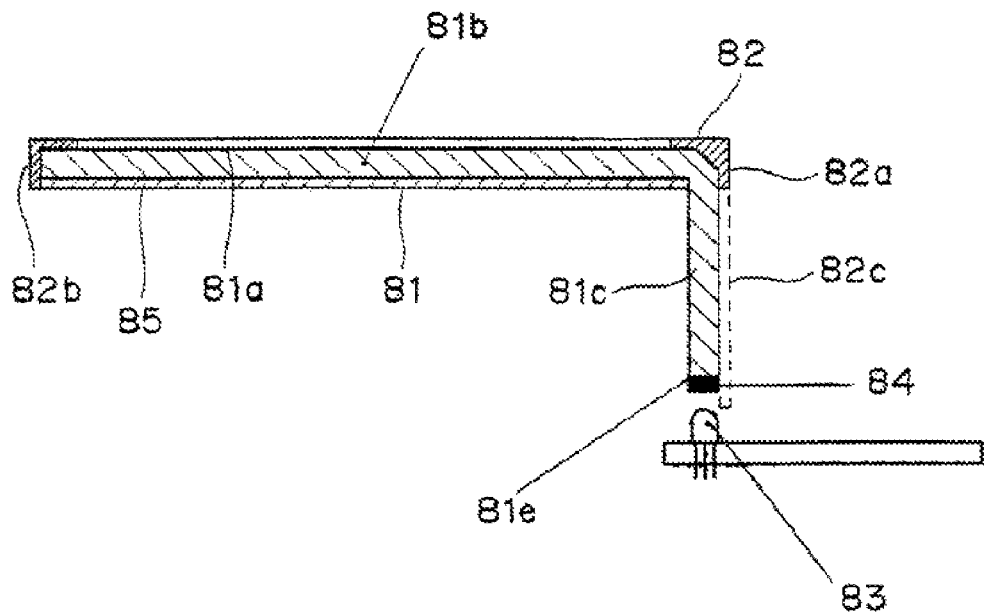
FIG. 8 is a sectional view on an enlarged scale, showing the planar light emitting element shown in FIG. 7.
Figure 8:
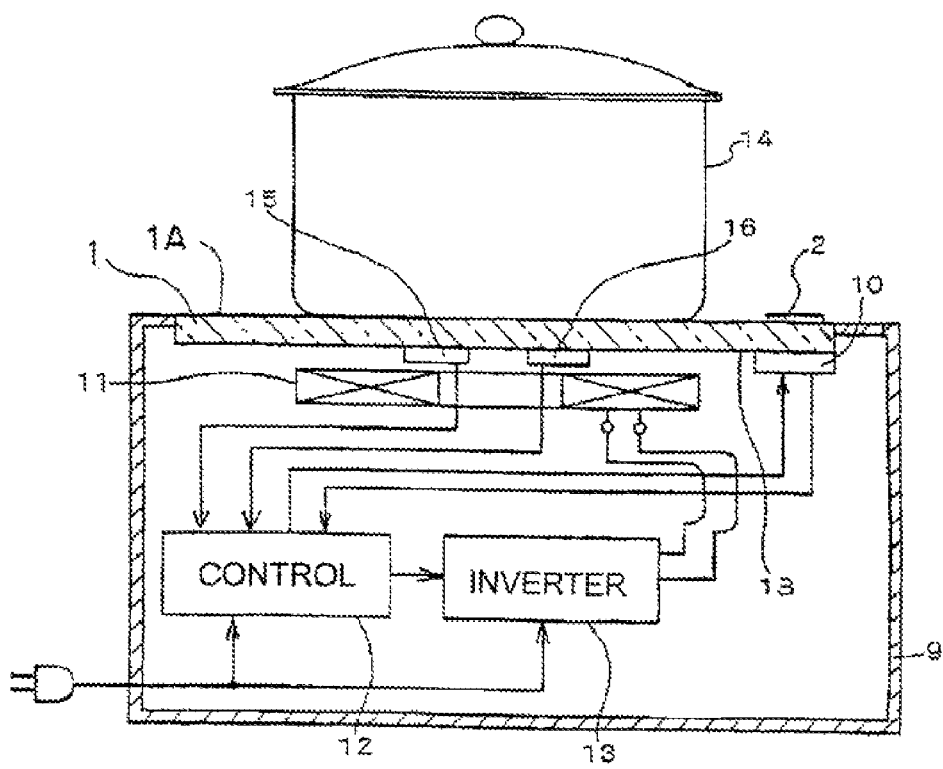

FIGS. 7 and 8 illustrate a fragmentary perspective view and a fragmentary sectional view showing an important portion of the induction heating appliance, which is the heating appliance for cooking according to a third preferred embodiment of the present invention.

Planar light emitting members 81 shown in FIG. 7 differ from the planar light emitting member 71 shown in FIG. 5, in that they are separated in correspondence with the operating buttons 49 to 51. Each of the planar light emitting members 81 includes a light emitting portion 81b having a top face defining a light emitting face 81a, a light guide portion 81c, a light incident portion 81d and the end face 81e defining a light incident face of the light incident portion 81d in a manner similar to those shown in FIG. 5. As best shown in FIG. 8, each of the planar light emitting members 81 is encased from below into a holder frame 82 with a side end face of the light emitting portion 81b covered by a side face of the holder frame 82. So far shown in FIG. 8, a forward end face of the light emitting portion 81b is covered by a front side face 82b of the holder frame 82, and an outer surface of a corner portion, which is a junction between a rear area of the light emitting portion 81b and the light guide portion 81c, is covered by a rear side face 82a of the holder frame 82. Each of light emitting diodes 83, which is a light source, is arranged as is the case with that shown in FIG. 5. It is to be noted that when the rear side face 82a of the holder frame 82 is provided with a rear side face extension 82c extending downwardly along a surface of the light guide portion 81c, that is, in a direction towards the light incident end face 81e, leakage of light from the light guide portion 81c can be prevented to increase the light emitting efficiency at the light emitting face 81a. Also, if an undersurface of the light emitting portion 81b, that is, a surface thereof opposite to the light emitting face 81a is provided with a reflective layer 85, which may be formed by pasting a white paper thereto, the efficiency of light emission from the light emitting face 81a can be increased.

The operation of, and effects brought about by, the heating appliance for cooking, which is so constructed as hereinabove described, will now be described.

Because of the foregoing construction, the operating buttons 49 to 51 can be illuminated independent of each other. For this reason, some of the operating buttons (for example, the arrow button 50 bearing a rightwardly oriented arrow when the heating power is maximum) that are not called for can be blacked out and, hence, invisible to the eyes of the user. Therefore, the user comes to recognize some of the plurality of operating buttons 49 to 51, which he or she considers necessary for manipulation and, hence, the operability can be increased considerably. In this embodiment of the present invention, only three operating buttons have been shown and described, but the larger the number of the buttons, the more this effect can be enhanced.

Since the arbitrarily chosen operating button or buttons are so structured as to emit differently colored light as the color of the corresponding light emitting diode 83 is changed, the color of the important operating button or buttons (for example, the ON/OFF button) can be structurally easily changed and, therefore, easy for the user to recognize with the operability consequently increased further.

Also, if a differently colored filter 84 is interposed between the light incident end face 81e of the planar light emitting body 81 and the corresponding light emitting diode 83 to allow the plurality of the operating buttons to emit light of a different color, a substrate can be fabricated with the light emitting diodes 83 of the same color in order to secure effects similar to those described above and, therefore, not only can the assemblage be improved, but also the color of the important operating button (for example, the ON/OFF button) can be changed, making it easy for the user to recognize and to considerably increase the operability.

It is to be noted that although in describing the foregoing preferred embodiments of the present invention, reference has been made to the heating appliance for cooking which includes the top plate having the operating buttons formed therein and also includes the heating coils and the radiant heater unit, the present invention is equally applicable to any other heating source, for example, a halogen type heater or a gas cooking appliance including a top plate having a hole formed for accommodating a burner and, even in this case, effects similar to those hereinabove described can be obtained.

The present invention having been described in detail as above, the heating appliance for cooking according to the present invention is of a type in which the visibility of the operating buttons can be considerably increased and the design and the operability can also be increased considerably and, accordingly, the present invention can be applied to any other cooking appliance employing one or a combination of an induction heating type having an operating unit provided in the top plate, a halogen type, a radiant type or a gas heater.

The invention claimed is:

1. A heating appliance for cooking, which comprises:
   a housing;
   a top plate in the form of a plate-like member made of a material having an electrically insulating property and a light transmitting property and mounted atop the housing;
   a heating unit disposed inside the housing for heating an article to be heated which has been placed on a top surface of the housing;
   an operating region defined on the top plate and formed by coloring the top plate so as to have a low transmittance of light passing through the top plate;
   a plurality of conductor detecting units formed of an electrically conductive material on a rear surface of the operating region;
   a control unit operable to control the heating unit based on a command inputted in response to detection that a surface portion of the top plate proximate to the conductor detecting units has been touched;
   conductor connectors made of an electrically conductive material and provided on the rear surface of the operating region and connected with outer edges of the conductor detecting units;
   a connecting terminal held in contact with the conductor connectors and electrically connected with the control unit;
   a plurality of planar light emitting members disposed below the conductor detecting units in face-to-face relation therewith; and
   a light source for emitting rays of light that are incident upon the planar light emitting members;
   wherein each of the conductor detecting units is provided with a frame display, formed by a frame shaped slotted portion, and a command display formed inwardly of the frame display and bearing an alphanumerical character or a pictorial letter in the form of a slotted portion for displaying the command;
   wherein the control unit is operable to cause the plural planar light emitting members to be lit one at a time; and
   wherein a light shielding film having an insulating property is formed around the conductor detecting units and the conductor connectors so that when the control unit causes one of the planar light emitting members to emit light, the frame display and the command display thereof are illuminated, and when the control unit causes the one of the planar light emitting members to be blacked out, the frame display and the command display thereof are rendered difficult to see.

2. The heating appliance for cooking as claimed in claim 1, wherein the frame display of each of the conductor detecting units is formed in a generally rectangular shape, and a bridge portion is provided for partially connecting an outside portion of the frame display and an inside portion of the frame display, the bridge portion being provided in at least one location on at least one side edge portion of the frame display.

3. The heating appliance for cooking as claimed in claim 1, wherein the frame display of each of the conductor detecting units is formed in a generally rectangular shape, and a bridge portion is provided for partially connecting an outside portion of the frame display and an inside portion of the frame display, the bridge portion being provided in at least one location on at least one corner portion of the frame display.

4. The heating appliance for cooking as claimed in claim 1, wherein each of the planar light emitting members comprises a plate shaped light emitting body having a light emitting face formed therein in face-to-face relation with one of the conductor detecting units and a plate shaped light guide portion lying perpendicular to the light emitting face, and wherein the light from the light source is allowed to enter an end face of the light guide portion formed at a location spaced from the top plate a further distance as compared with that from the light emitting body.

5. A heating appliance for cooking, which comprises:
   a housing;
   a top plate in the form of a plate-like member made of a material having an electrically insulating property and a light transmitting property and mounted atop the housing;
   a heating unit disposed inside the housing for heating an article to be heated which has been placed on a top surface of the housing;
   an operating region defined on the top plate and formed by coloring the top plate so as to have a low transmittance of light passing through the top plate;
   a plurality of conductor detecting units formed of an electrically conductive material on a rear surface of the operating region;
   a control unit operable to control the heating unit based on a command inputted in response to detection that a surface portion of the top plate proximate to the conductor detecting units has been touched;

conductor connectors made of an electrically conductive material and provided on the rear surface of the operating region and connected with outer edges of the conductor detecting units;

a connecting terminal held in contact with the conductor connectors and electrically connected with the control unit;

a plurality of planar light emitting members disposed below the conductor detecting units in face-to-face relation therewith; and a light source for emitting rays of light that are incident upon the planar light emitting members;

wherein each of the conductor detecting units is provided with a frame display, formed by a frame shaped slotted portion, and a command display formed inwardly of the frame display and bearing an alphanumerical character or a pictorial letter in the form of a slotted portion for displaying the command;

wherein the control unit is operable to cause the plural planar light emitting members to be lit in a different color; and wherein a light shielding film having an insulating property is formed around the conductor detecting units and the conductor connectors so that when the control unit causes one of the planar light emitting members to emit light, the frame display and the command display thereof are illuminated, and when the control unit causes the one of the planar light emitting members to be blacked out, the frame display and the command display thereof are rendered difficult to see.

6. The heating appliance for cooking as claimed in claim 5, wherein the plurality of the planar light emitting members are lit in different colors by changing the color of the light emitted from the light source.

7. The heating appliance for cooking as claimed in claim 5, further comprising filters of different colors interposed between end faces of the planar light emitting member, on which the light from the light source impinges, and the light source to allow the plural planar light emitting members to be lit in different colors.

8. The heating appliance for cooking as claimed in claim 5, wherein the frame display of each of the conductor detecting units is formed in a generally rectangular shape, and a bridge portion is provided for partially connecting an outside portion of the frame display and an inside portion of the frame display, the bridge portion being provided in at least one location on at least one side edge portion of the frame display.

9. The heating appliance for cooking as claimed in claim 5, wherein the frame display of each of the conductor detecting units is formed in a generally rectangular shape, and a bridge portion is provided for partially connecting an outside portion of the frame display and an inside portion of the frame display, the bridge portion being provided in at least one location on at least one corner portion of the frame display.

10. The heating appliance for cooking as claimed in claim 5, wherein each of the planar light emitting members comprises a plate shaped light emitting body having a light emitting face formed therein in face-to-face relation with one of the conductor detecting units and a plate shaped light guide portion lying perpendicular to the light emitting face, and wherein the light from the light source is allowed to enter an end face of the light guide portion formed at a location spaced from the top plate a further distance as compared with that from the light emitting body.

* * * * *